United States Patent
Scheller et al.

(10) Patent No.: US 11,585,868 B2
(45) Date of Patent: Feb. 21, 2023

(54) SYSTEMS AND METHODS FOR MAGNETIC FIELD SENSORS WITH SELF-TEST

(71) Applicant: Allegro MicroSystems, LLC, Manchester, NH (US)

(72) Inventors: P. Karl Scheller, Dover, NH (US); James E. Burgess, Strafford, NH (US); Steven E. Snyder, New Boston, NH (US); Kristann L. Moody, Strafford, NH (US); Devon Fernandez, Londonderry, NH (US); Andrea Foletto, Andorno Micca (IT)

(73) Assignee: Allegro MicroSystems, LLC, Manchester, NH (US)

( * ) Notice: Subject to any disclaimer, the term of this patent is extended or adjusted under 35 U.S.C. 154(b) by 350 days.

(21) Appl. No.: 16/994,864

(22) Filed: Aug. 17, 2020

(65) Prior Publication Data
US 2020/0379061 A1 Dec. 3, 2020

Related U.S. Application Data

(60) Division of application No. 15/816,045, filed on Nov. 17, 2017, now Pat. No. 10,782,363, which is a
(Continued)

(51) Int. Cl.
*G01R 33/06* (2006.01)
*G01R 33/00* (2006.01)
(Continued)

(52) U.S. Cl.
CPC ..... *G01R 33/0023* (2013.01); *G01D 5/24476* (2013.01); *G01P 3/44* (2013.01);
(Continued)

(58) Field of Classification Search
CPC ..... G01D 5/24476; G01P 13/00; G01P 21/02; G01P 3/44; G01P 3/487; G01P 3/488;
(Continued)

(56) References Cited

U.S. PATENT DOCUMENTS

| 3,398,366 A | 8/1968 | Apfelbeck |
| 4,004,217 A | 1/1977 | Giffard |

(Continued)

FOREIGN PATENT DOCUMENTS

| DE | 42 27 113 A1 | 2/1994 |
| DE | 44 05 801 A1 | 8/1995 |

(Continued)

OTHER PUBLICATIONS

Response (with English Translation) to Office Action dated Feb. 3, 2021 for German Application No. 112008001889.8; Response filed on Jun. 9, 2021; 37 Pages.

(Continued)

*Primary Examiner* — Lee E Rodak
*Assistant Examiner* — Brent J Andrews
(74) *Attorney, Agent, or Firm* — Daly, Crowley, Mofford & Durkee, LLP

(57) ABSTRACT

Systems, methods, and apparatuses for magnetic field sensors with self-test include a detection circuit to detect speed and direction of a target. One or more circuits to test accuracy of the detected speed and direction may be included. One or more circuits to test accuracy of an oscillator may also be included. One or more circuits to test the accuracy of an analog-to-digital converter may also be included. Additionally, one or more IDDQ and/or built-in-self test (BIST) circuits may be included.

19 Claims, 12 Drawing Sheets

Related U.S. Application Data continuation of application No. 14/337,613, filed on Jul. 22, 2014, now Pat. No. 9,851,416.

(51) Int. Cl.

| | | |
|---|---|---|
| *G01D 5/244* | (2006.01) | |
| *G01P 3/487* | (2006.01) | |
| *G01P 3/488* | (2006.01) | |
| *G01P 21/02* | (2006.01) | |
| *G01R 23/00* | (2006.01) | |
| *G01P 3/44* | (2006.01) | |
| *G01P 13/00* | (2006.01) | |

(52) U.S. Cl.
CPC .............. *G01P 3/487* (2013.01); *G01P 3/488* (2013.01); *G01P 13/00* (2013.01); *G01P 21/02* (2013.01); *G01R 23/005* (2013.01); *G01R 33/06* (2013.01)

(58) Field of Classification Search
CPC ... G01R 23/005; G01R 33/0023; G01R 33/06
See application file for complete search history.

(56) References Cited

U.S. PATENT DOCUMENTS

| | | | |
|---|---|---|---|
| 5,729,476 | A | 3/1998 | Pfau |
| 5,793,778 | A | 8/1998 | Qureshi |
| 5,854,598 | A | 12/1998 | De Vries et al. |
| 5,917,320 | A | 6/1999 | Scheller et al. |
| 6,091,239 | A | 7/2000 | Vig et al. |
| 6,191,608 | B1 | 2/2001 | Cliff et al. |
| 6,191,698 | B1 | 2/2001 | Hennig et al. |
| 6,288,567 | B1 | 9/2001 | Fink |
| 6,297,627 | B1 | 10/2001 | Towne et al. |
| 6,420,868 | B1 | 7/2002 | Ganther, Jr. et al. |
| 6,542,847 | B1 | 4/2003 | Lohberg et al. |
| 6,545,495 | B2 | 4/2003 | Warmack et al. |
| 6,687,644 | B1 | 2/2004 | Zinke et al. |
| 6,693,419 | B2 | 2/2004 | Stauth et al. |
| 6,815,944 | B2 | 11/2004 | Vig et al. |
| 6,968,484 | B2 | 11/2005 | Hummel |
| 6,980,005 | B2 | 12/2005 | Finlay, Sr. et al. |
| 7,026,808 | B2 | 4/2006 | Vig et al. |
| 7,096,386 | B2 | 8/2006 | Ozawa |
| 7,184,876 | B2 | 2/2007 | Teulings et al. |
| 7,199,579 | B2 | 4/2007 | Scheller et al. |
| 7,319,418 | B2 | 1/2008 | Fink |
| 7,327,153 | B2 | 2/2008 | Weinraub |
| 7,466,123 | B2 | 12/2008 | Kato et al. |
| 7,694,200 | B2 | 4/2010 | Forrest et al. |
| 7,800,389 | B2 | 9/2010 | Friedrich et al. |
| 8,299,783 | B2 | 10/2012 | Fernandez et al. |
| 8,624,588 | B2 | 1/2014 | Vig et al. |
| 9,851,416 | B2 | 12/2017 | Scheller et al. |
| 2001/0002791 | A1 | 6/2001 | Tsuge et al. |
| 2002/0017926 | A1 | 2/2002 | Saito |
| 2002/0109501 | A1 | 8/2002 | Schroeder |
| 2002/0196052 | A1 | 12/2002 | Furuya |
| 2003/0227400 | A1 | 12/2003 | Giddens et al. |
| 2004/0059959 | A1 | 3/2004 | Ozawa |
| 2006/0208729 | A1 | 9/2006 | Forrest et al. |
| 2007/0188245 | A1 | 8/2007 | Kraemer et al. |
| 2008/0133158 | A1 | 6/2008 | Koo |
| 2008/0303468 | A1 | 12/2008 | Muller |
| 2010/0026279 | A1 | 2/2010 | Vig et al. |
| 2010/0103006 | A1 | 4/2010 | Miyake et al. |
| 2010/0241302 | A1 | 9/2010 | Shimizu |
| 2011/0290036 | A1 | 12/2011 | Pflum |
| 2011/0298448 | A1* | 12/2011 | Foletto ..................... G01D 5/14 324/207.13 |
| 2011/0298449 | A1 | 12/2011 | Foletto et al. |
| 2012/0025817 | A1* | 2/2012 | Romero ................. G01R 33/07 324/251 |
| 2012/0274563 | A1 | 11/2012 | Olsson |
| 2013/0265036 | A1 | 10/2013 | Friedrich et al. |
| 2013/0320970 | A1 | 12/2013 | Foletto et al. |
| 2013/0335069 | A1 | 12/2013 | Vig et al. |
| 2014/0009144 | A1* | 1/2014 | Romero ............. G01R 33/0041 324/251 |
| 2014/0062358 | A1* | 3/2014 | Reynolds ................ H02P 25/03 318/400.06 |
| 2014/0084903 | A1 | 3/2014 | Vig et al. |
| 2014/0084904 | A1 | 3/2014 | Vig et al. |
| 2016/0123780 | A1 | 5/2016 | Snyder et al. |
| 2018/0088184 | A1 | 3/2018 | Scheller et al. |

FOREIGN PATENT DOCUMENTS

| | | |
|---|---|---|
| DE | 44 444 08 A1 | 6/1996 |
| DE | 10 2004 006268 A1 | 9/2004 |
| DE | 11 2008 001 889 T5 | 5/2010 |
| EP | 1 580 561 A1 | 9/2005 |
| EP | 1 662 353 A1 | 5/2006 |
| JP | S63-185555 A | 8/1988 |
| JP | 02-271256 | 11/1990 |
| JP | 03-096809 | 4/1991 |
| JP | 05-014196 | 1/1993 |
| JP | 06-300584 | 10/1994 |
| JP | 07-066649 | 3/1995 |
| JP | 09-079004 | 3/1997 |
| JP | H10-504436 A | 4/1998 |
| JP | 2003-195933 | 7/2003 |
| JP | 2006-098140 A | 4/2006 |
| KR | 2002-0013800 A | 2/2002 |
| WO | WO 2006/056829 A1 | 6/2006 |
| WO | WO 2013/180852 A1 | 12/2013 |
| WO | WO 2013/191891 | 12/2013 |
| WO | WO 2016/069216 A2 | 5/2016 |

OTHER PUBLICATIONS

German Office Action with English translation dated Feb. 3, 2021 for German Application No. 11 2008 001 889.8; 15 pages.

European Communication pursuant to Rules 161 (1) and 162 EPC dated Mar. 1, 2017; for European Application No. 15736878.8; 2 pages.

Response to European Office Action dated Mar. 1, 2017 for European Application No. 15736878.8; Response filed on Sep. 7, 2017; 12 pages.

U.S. Non-Final Office Action dated Jan. 13, 2017 for U.S. Appl. No. 14/337,613; 27 pages.

Response to U.S. Non-Final Office Action dated Jan. 13, 2017 for U.S. Appl. No. 14/337,613; Response Filed on Apr. 12, 2017; 12 Pages.

U.S. Final Office Action dated Jul. 21, 2017 for U.S. Appl. No. 14/337,613; 29 pages.

Response to U.S. Final Office Action dated Jul. 21, 2017 for U.S. Appl. No. 14/337,613; Response filed Aug. 14, 2017; 10 pages.

Notice of Allowance dated Aug. 25, 2017 for U.S. Appl. No. 14/337,613; 10 pages.

PCT International Search Report and Written Opinion dated Apr. 11, 2016 for International Application No. PCT/US2015/037098; 25 pages.

PCT Invitation to pay additional fees with partial search report dated Dec. 7, 2015 for International Application No. PCT/US2015/037098; 9 pages.

PCT Invitation to pay additional fees and Partial Search Report dated Feb. 5, 2016 for International Application No. PCT/US2015/054172; 8 pages.

PCT International Preliminary Report dated Feb. 2, 2017 for International Application No. PCT/US2015/037098; 16 Pages.

PCT International Preliminary Report on Patentability dated May 11, 2017 for International Application No. PCT/US2015/054172; 14 pages.

PCT International Search Report and Written Opinion dated Apr. 21, 2017 for International Application No. PCT/US2015/054172; 23 pages.

(56) References Cited

OTHER PUBLICATIONS

U.S. Final Office Action dated Jun. 2, 2017 for U.S. Appl. No. 14/529,497; 21 pages.
Response to U.S. Final Office Action dated Jun. 2, 2017 for U.S. Appl. No. 14/529,497; Response filed Aug. 14, 2017; 25 pages.
U.S. Non-Final Office Action dated Nov. 14, 2016 for U.S. Appl. No. 14/529,497; 15 pages.
Response to U.S. Non-Final Office Action dated Nov. 14, 2016 for U.S. Appl. No. 14/529,497; Response filed Feb. 14, 2017; 25 pages.
U.S. Non-Final Office Action dated Dec. 12, 2017 for U.S. Appl. No. 14/529,497; 35 pages.
Response to U.S. Non-Final Office Action dated Dec. 12, 2017 for U.S. Appl. No. 14/529,497; Response filed on Feb. 12, 2018; 18 Pages.
U.S. Final Office Action dated Jun. 26, 2018 for U.S. Appl. No. 14/529,497; 36 pages.
Response dated Sep. 20, 2018 to Final Office Action dated Jun. 26, 2018 for U.S. Appl. No. 14/529,497; 16 Pages.
Notice of Allowance dated Oct. 4, 2018, for U.S. Appl. No. 14/529,497; 8 Pages.
U.S. Non-Final Office Action dated Jul. 21, 2009 for U.S. Appl. No. 11/779,354; 8 pages.
Response to U.S. Non-Final Office Action dated Jul. 21, 2009 for U.S. Appl. No. 11/779,354; Response filed Oct. 19, 2009; 15 pages.
Notice of Allowance dated Dec. 17, 2009; for U.S. Appl. No. 11/779,354; 5 pages.
PCT International Search Report and Written Opinion of the dated Sep. 19, 2008 for International Application No. PCT/US2008/067060; 15 pages.
English Translation of German Office Action dated May 10, 2017 for German Application No. 112008001889.8; 6 pages.
Japanese Office Action (English Translation only) dated Aug. 29, 2012 for Japanese Application No. 2010-517046; 3 Pages.
Response (with English Claims) to Japanese Office Action dated Aug. 29, 2012 for Japanese Application No. 2010-517046; Response filed on Nov. 28, 2012; 13 Pages.
PCT International Preliminary Report dated Jan. 19, 2010 for International Application No. PCT/US2008/067060; 10 pages.
Japanese Notice of Allowance dated May 24, 2013 for Japanese Application No. 2010-517046; 4 Pages.
Japanese Office Action (English Translation only) dated Jan. 4, 2013 for Japanese Application No. 2010-517046; 2 Pages.
Response filed Apr. 19, 2013 (with English Claims) and Demand of Appeal to the Office Action dated Jan. 4, 2013 for Japanese Application No. 2010-517046; 12 Pages.
Japanese Office Action (with English Translation) dated Sep. 9, 2013 for Japanese Application No. 2013-088148; 4 Pages.
Response (with English Translation) to Japanese Office Action dated Sep. 9, 2013 for Japanese Application No. 2013-088148; Response filed on Oct. 15, 2013; 8 Pages.
Japanese Notice of Allowance (with English Translation) dated Nov. 8, 2013 for Japanese Application No. 2013-088148; 6 Pages.
European Communication Pursuant to Article 94(3) EPC dated Jun. 13, 2018 for European Application No. EP 15736878.8.
European Response filed Aug. 22, 2018 for European Application No. 15736878.8; 17 pages.
European Intention to Grant dated Jan. 7, 2020 for European Application No. 15736878.8; 7 Pages.
Korean Office Action (with Machine English Translation) dated Jan. 20, 2020 for Korean Application No. 10-2017-7002973; 13 Pages.
Response (with English Translation) to Korean Office Action dated Jan. 20, 2020 for Korean Application No. 10-2017-7002973; Response filed Feb. 24, 2020; 30 Pages.
Korean Notice of Allowance (with English Translation & Allowed Claims) dated Jun. 22, 2020 for Korean Application No. 10-2017-7002973; 10 Pages.
European Rules 161/162 Communication dated Jun. 2, 2017 for European Application No. 15784210.5; 2 Pages.
European Response to Communication dated Nov. 29, 2017 for European Application No. 15784210.5; 19 pages.
Notice of Allowance dated Jun. 24, 2019 for European Application No. 15784210.5; 7 Pages.
Response (with Machine English Translation and Amended Claims) to German Office Action dated May 10, 2017 for German Application No. 112008001889.8; Response filed Sep. 15, 2017; 15 Pages.
U.S. Restriction Requirement dated Dec. 18, 2019 for U.S. Appl. No. 15/816,045; 7 Pages.
Response to U.S. Restriction Requirement dated Dec. 18, 2019 for U.S. Appl. No. 15/816,045; Response Filed Dec. 18, 2019; 1 Page.
U.S. Non-Final Office Action dated Feb. 4, 2020 for U.S. Appl. No. 15/816,045; 18 Pages.
Response to U.S. Non-Final Office Action dated Feb. 4, 2020 for U.S. Appl. No. 15/816,045; Response Filed Apr. 10, 2020; 12 Pages.
U.S. Notice of Allowance dated Aug. 5, 2020 for U.S. Appl. No. 15/816,045; 22 Pages.
U.S. Appl. No. 17/647,639, filed Jan. 11, 2022, Rubinsztain et al.

* cited by examiner

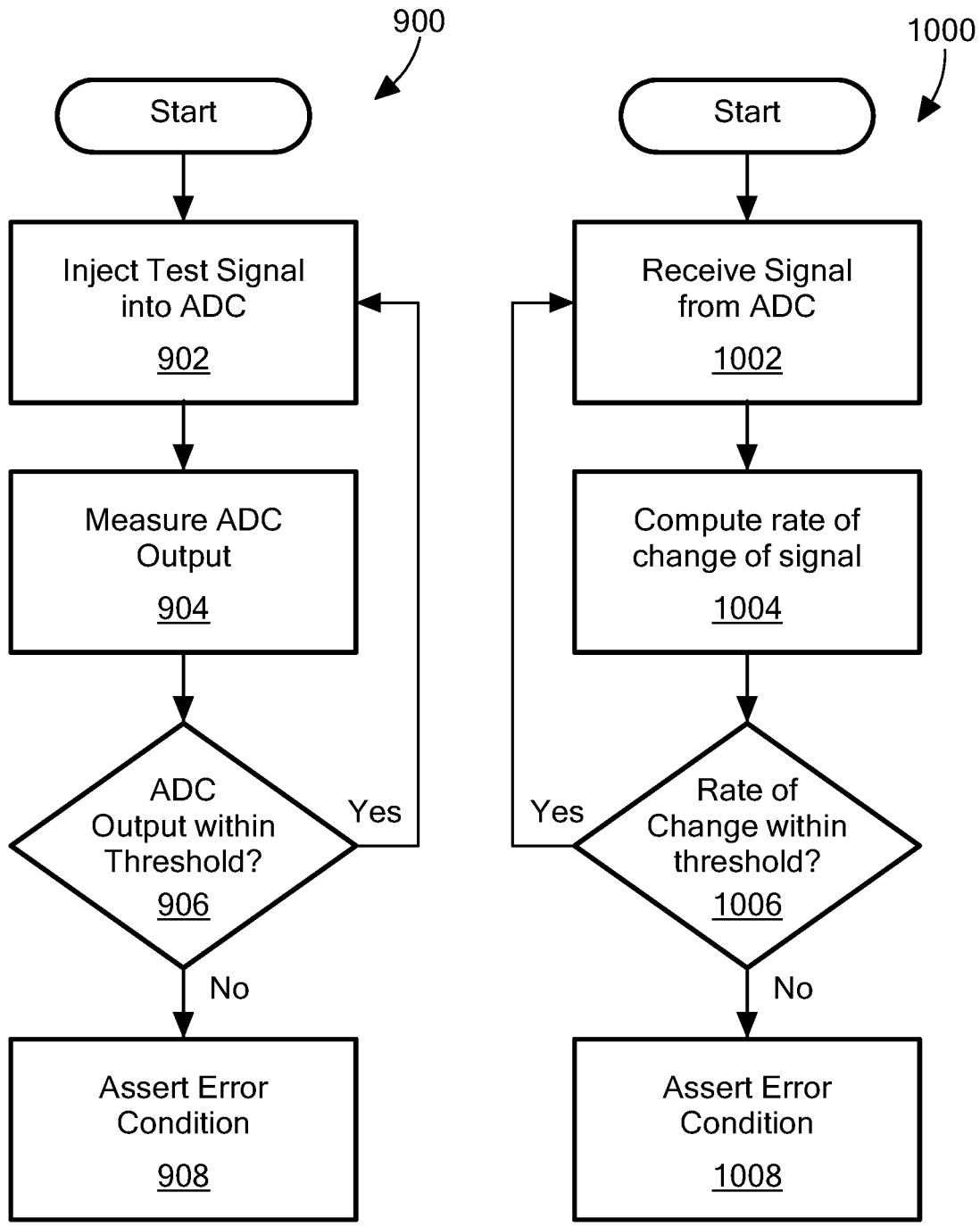
*FIG. 9*          *FIG. 10*

SYSTEMS AND METHODS FOR MAGNETIC FIELD SENSORS WITH SELF-TEST

CROSS REFERENCE TO RELATED APPLICATIONS

This is a Divisional application of U.S. patent application Ser. No. 15/816,045, filed Nov. 17, 2017, entitled "SYSTEMS AND METHODS FOR MAGNETIC FIELD SENSORS WITH SELF-TEST," which is a Continuation application of U.S. patent application Ser. No. 14/337,613 filed Jul. 22, 2014, entitled "SYSTEMS AND METHODS FOR MAGNETIC FIELD SENSORS WITH SELF-TEST." Each application in this paragraph is incorporated herein by reference in its entirety.

FIELD

This disclosure relates to magnetic field sensors and, more particularly, to magnetic field sensors having self-test capabilities.

BACKGROUND

Magnetic field sensors including a magnetic field sensing element, or transducer, such as a Hall Effect element or a magnetoresistive element, are used in a variety of applications to detect aspects of movement of a ferromagnetic article, or target, such as proximity, speed, and direction. Applications using these sensors include, but are not limited to, a magnetic switch or "proximity detector" that senses the proximity of a ferromagnetic article, a proximity detector that senses passing ferromagnetic articles (for example, magnetic domains of a ring magnet or gear teeth), a magnetic field sensor that senses a magnetic field density of a magnetic field, and a current sensor that senses a magnetic field generated by a current flowing in a current conductor. Magnetic field sensors are widely used in automobile control systems, for example, to detect ignition timing from a position of an engine crankshaft and/or camshaft, and to detect a position and/or rotation of an automobile wheel for anti-lock braking systems.

Magnets, in the form of a permanent magnet, or magnetically permeable structures, sometimes referred to as concentrators or flux guides, are often used in connection with magnetic field sensors. In applications in which the ferromagnetic target is magnetic, a magnetically permeable concentrator or magnetic flux guide can be used to focus the magnetic field generated by the target on the magnetic field transducer in order to increase the sensitivity of the sensor and, allow use of a smaller magnetic target, or allow the magnetic target to be sensed from a greater distance (i.e., a larger airgap). In other applications in which the ferromagnetic target is not magnetic, a permanent magnet, sometimes referred to as a back bias magnet, may be used to generate the magnetic field that is then altered by movement of the target.

If a back bias magnet is used, the magnetic field sensing elements used in an application for detecting a target are placed within the magnetic field formed by the back bias magnet. Thus, the magnetic field sensing elements detect changes in bias magnetic field caused by movement of the target.

Generally, back bias magnets, on their own, do not produce a uniform magnetic field across the area where the magnetic field sensing elements are positioned, particularly over temperature. If the magnetic field sensing elements are placed within a non-uniform magnetic field, each of the sensors may be subject to a different DC offset. Compensating for the different DC offsets requires additional circuitry or algorithms that can increase the cost of the magnetic field sensor. Thus, concentrators are sometimes used in conjunction with back bias magnets to reduce the non-uniformity of the bias field. However, concentrators add cost to the magnetic circuit and can reduce the minimum usable air gap.

SUMMARY

In an embodiment, an apparatus comprises: a detection circuit to detect speed and direction of a target. The detection circuit includes one or more magnetic field sensing elements, a first signal channel to output a first signal, a second signal channel to output a second signal. The first and second signals correspond to a position of the target in relation to the one or more magnetic field sensing elements. An oscillator to provide an oscillating output and an analog-to-digital converter is also included.

The apparatus may also comprise a first test circuit to determine if the apparatus is detecting speed and/or direction accurately. The first test circuit includes a counter coupled to the signal channels such that the first signal channel increments the counter and the second signal channels decrements the counter. The first test circuit also includes circuitry to assert an error condition if a count of the counter exceeds a predetermined threshold.

The apparatus may also comprise a second test circuit coupled to the oscillator to determine whether the oscillator is oscillating within a predetermined frequency range, and a ramp generator to generate a voltage ramp signal that decays over time and resets upon detection of an edge of the oscillating output. The second test circuit may also include a comparator circuit to determine whether a voltage level of the voltage ramp signal is between a predetermined voltage range upon detection of the edge of the oscillating output.

The apparatus may also comprise a third test circuit coupled to the analog-to-digital converter to determine whether the analog-to-digital converter is operating with an expected accuracy. The third test circuit comprises an output to inject an analog test signal into an input of the analog-to-digital converter, an input coupled to receive a digital signal from the analog-to-digital converter representing a conversion of the analog test signal, and a comparator circuit to compare the digital signal to an expected value; and A fourth test circuit may be coupled to receive the digital signal from the analog-to-digital converter, compute a rate of change of the output of the analog-to-digital converter, and determine whether the rate of change is within a predetermined range defined by a mechanical system to which the target is attached.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

FIG. 9 is a flowchart of a method for testing an analog-to-digital converter.

FIG. 10 is a flowchart of another method for testing an analog-to-digital converter.

DETAILED DESCRIPTION

Figure 1:
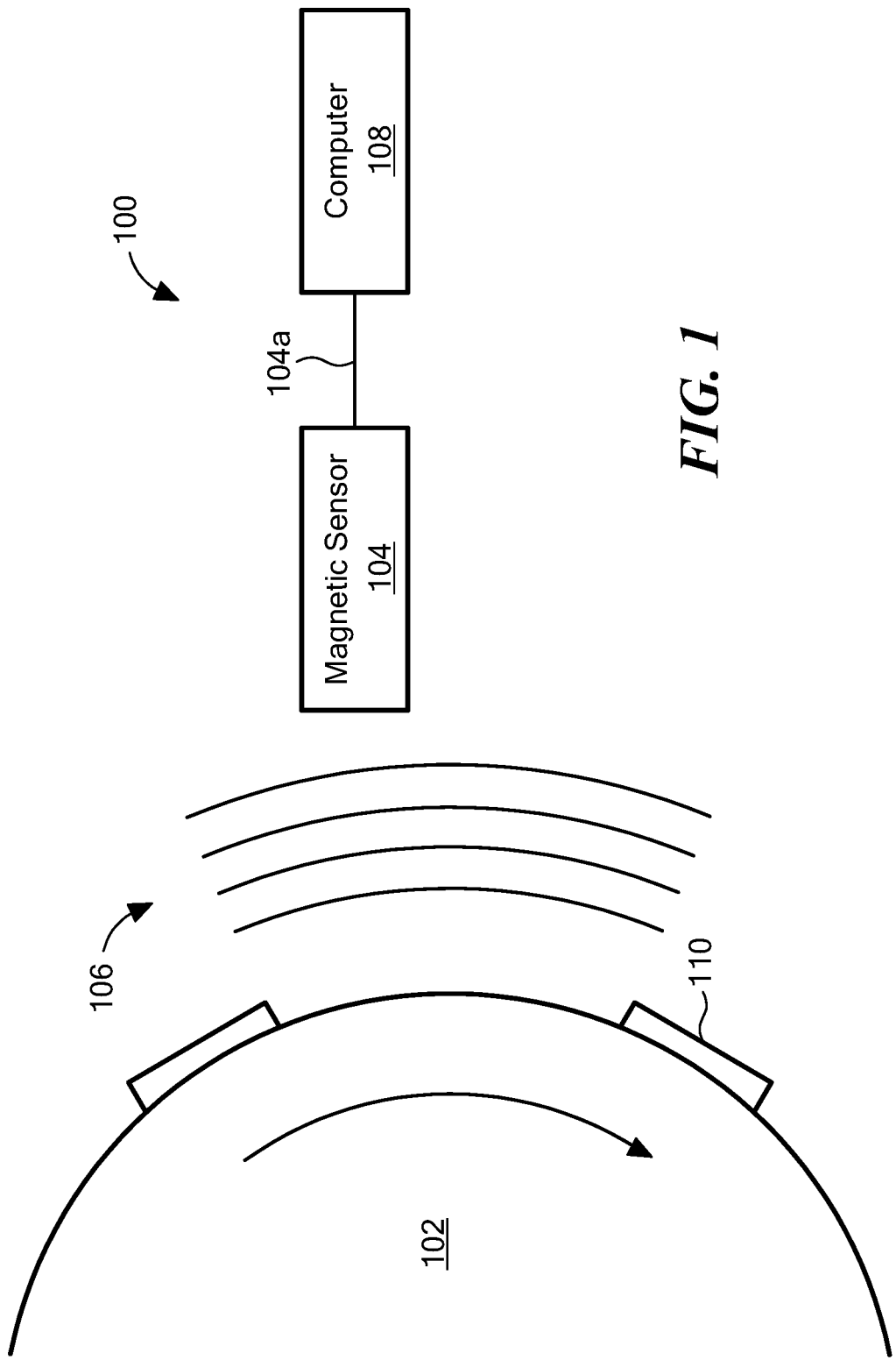
FIG. 1 is a block diagram of a system for detecting a magnetic target including a magnetic sensor and a computer.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, a magnetic tunnel junction (MTJ), a spin-valve, etc. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR, spin-valve) and vertical Hall elements tend to have axes of sensitivity parallel to a substrate.

It will be appreciated by those of ordinary skill in the art that while a substrate (e.g. a semiconductor substrate) is described as "supporting" the magnetic field sensing element, the element may be disposed "over" or "on" the active semiconductor surface, or may be formed "in" or "as part of" the semiconductor substrate, depending upon the type of magnetic field sensing element. For simplicity of explanation, while the embodiments described herein may utilize any suitable type of magnetic field sensing elements, such elements will be described here as being supported by the substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "target" is used to describe an object to be sensed or detected by a magnetic field sensor or magnetic field sensing element. A target may be ferromagnetic or magnetic.

As is known in the art, magnetic fields have direction and strength. The strength of a magnetic field can be described as magnetic flux or flux density. Therefore, the terms magnetic field "strength" and magnetic "flux" may be used interchangeably in this document.

FIG. 1 is a block diagram of a system 100 for detecting a target 102. System 100 includes a magnetic sensor 104 placed adjacent to target 102 so that a magnetic field 106 can be sensed by magnetic sensor 104. In an embodiment, target 102 is a magnetic target and produces magnetic field 106. In another embodiment, magnetic field 106 is generated by a magnetic source (e.g. a back-bias magnet or electromagnet) that is not coupled to target 102. In this instance, target 102 may be either a magnetic or a non-magnetic target. In the case where the target is a non-magnetic target, as target 102 moves through or within magnetic field 106, it causes perturbations to magnetic field 106 that can be detected by magnetic sensor 104.

Magnetic sensor 104 is coupled to a computer 108, which may be a general purpose processor executing software or firmware, a custom processor, or an electronic circuit for processing output signal 104a from magnetic sensor 104. Output signal 104a may provide information about the speed and direction of target 102 to computer 108, which may then perform operations based on the received speed and direction. In an embodiment, computer 108 is an automotive computer installed in a vehicle and target 102 is a moving part within the vehicle, such as a transmission shaft, a brake rotor, etc. Magnetic sensor 104 detects the speed and direction of target 102 and computer 108 controls automotive functions (like all-wheel drive, ABS, etc.) in response to the detected speed and direction.

Target 102 can comprise any element capable of affecting magnetic field 106 through motion or proximity. For example, target 102 may be a rotating shaft in an automotive transmission or brake system. As shown in FIG. 1, target 102 may have teeth 110. As target 102 moves or rotates, teeth 110 affect magnetic field 106, which can be detected by magnetic sensor 104. By detecting such changes to magnetic field 106, system 100 can determine speed and/or direction of target 102. Although shown as a rotating shaft, target 102 can take on any form capable of being detected by magnetic sensor. Target 102 can comprise a toothed rack in a rack and pinion system; a gear; a shaft with teeth, magnets, or other features on the end of the shaft; etc. Also, although shown as separate elements, computer 108 and magnetic sensor 104 may be part of the same circuit, part of the same integrated circuit, or contained in the same package.

Figure 2:
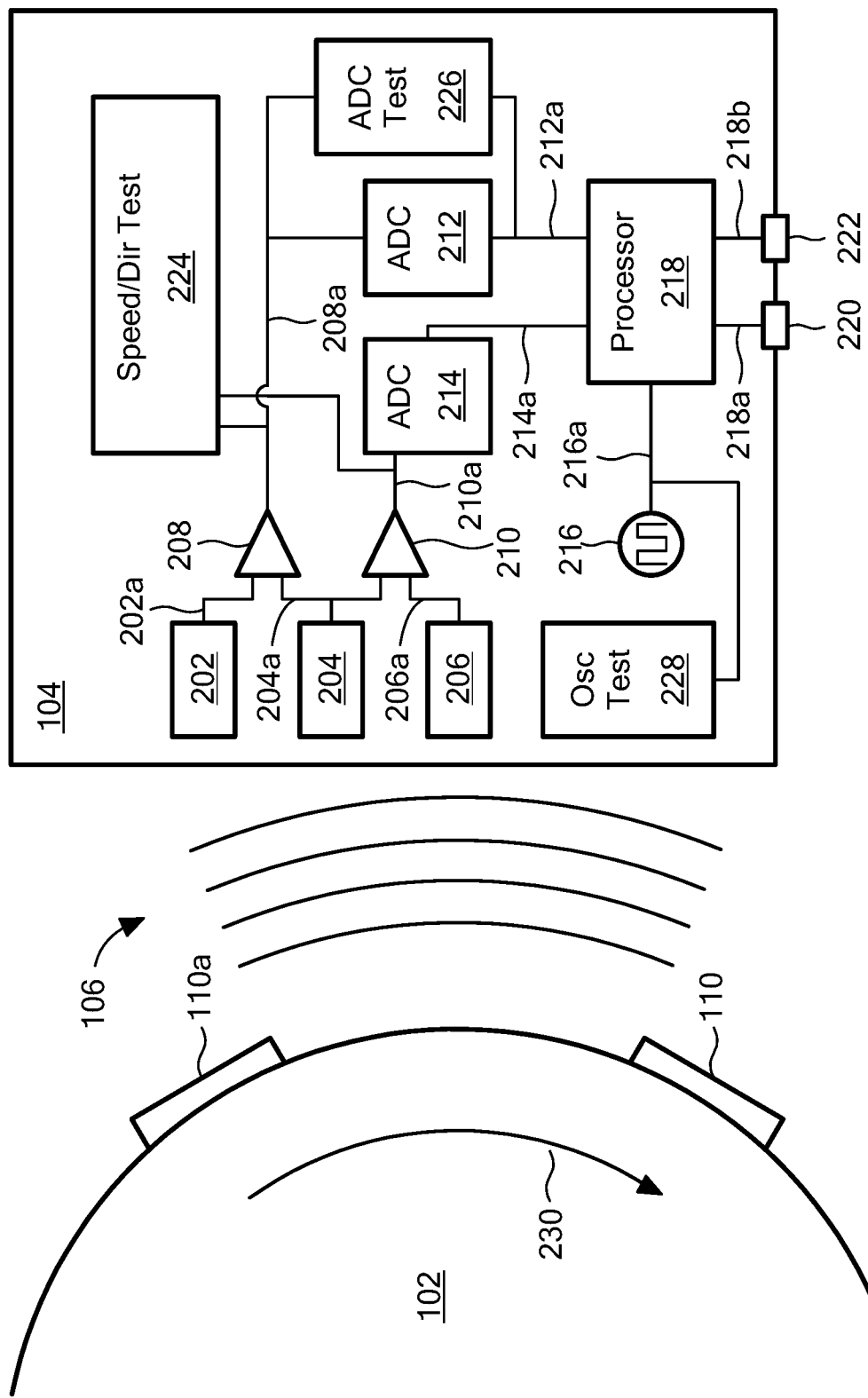
FIG. 2 is a block diagram of a system for detecting a magnetic target including a magnetic sensor.

Referring to FIG. 2, magnetic sensor 104 includes one or more magnetic field sensing elements 202, 204, 206. Magnetic field sensing elements 202, 204, 206 are positioned adjacent to target 102 to detect magnetic field 106. Each magnetic field sensing element provides a respective output signal 202a, 204a, or 206a, which represent the magnetic field as detected by magnetic field sensing element 202, 204, and 206, respectively. Magnetic field sensing elements 202, 204, and 206 may be Hall Effect elements, magnetoresistive elements, or other types of magnetic field sensing elements.

Differential amplifier 208 receives signal 202a and 204a, and differential amplifier 210 receives signals 204a and 206a. The output of differential amplifier 208 is a signal channel that provides a first signal 208a, which corresponds to a position of target 102 in relation to magnetic field sensing elements 202 and 204. Similarly, the output of differential amplifier 210 is a signal channel that provides a second signal 210a, which corresponds to a position of target 102 in relation to magnetic field sensing elements 204 and 206. Signals 208a and 210a are received by analog-to-digital converters ("ADC") 212 and 214, respectively. Although not shown in FIG. 2, magnetic sensor 104 may include filters or other signal-shaping circuits to condition and shape signals 208a and/or 210a prior to them being received by ADCs 212 and 214.

The embodiment shown in FIG. 2 includes three magnetic field sensing elements with differential amplifiers. However, other arrangements are possible. For example, if the differential amplifiers are removed, magnetic field sensor 104 may have two magnetic field sensing elements, each coupled to one of the ADCs. In this embodiment, one of the magnetic field sensing elements may provide signal 208a to ADC 212, and the other magnetic field sensing element may provide signal 210a to ADC 214. Other arrangements having more than three magnetic field sensing elements can also be used.

Magnetic field sensor 104 includes an oscillator 216 that provides an oscillating output 216a. Oscillator 216 may be non-crystal oscillator circuit (or a crystal oscillator circuit) and oscillating output 216a may be used as a clock signal.

As noted above, magnetic field sensor 104 also includes one or more ADC circuits 212 and 214 to convert analog signals received from differential amplifiers 208 and 210 to digital signals 212a and 214a. Digital signals 212a and 214a are received by processor circuit 218, which uses digital signals 212a and 214a to compute speed and/or direction of target 102. Processor 218 provides output signals 218a and 218b, which are coupled to external output pins 220 and 222 so that signals 218a and 218b can be received by an external circuit (e.g. by automotive computer 108 in FIG. 1). Output signals 218a and 218b may be the same as or similar to signal 104a shown in FIG. 1.

Magnetic field sensor 104 also includes a first test circuit 224 to test the speed and direction functions of magnetic field sensor 104, a second test circuit 226 to test the ADC functions of magnetic field sensor 104, and/or a third test circuit 228 to test the oscillator functions of magnetic field sensor 104. Additionally or alternatively, processor 218 may include IDDQ and/or BIST test circuitry to test magnetic field sensor 104 when it is operating within its operating environment (e.g. while installed in a vehicle). The test circuits will be described below in greater detail. Magnetic field sensor 104 may include one or more of test circuit 224, test circuit 226, test circuit 228, and/or the IDDQ/BIST test circuit in any combination. In various embodiments, magnetic field sensor 104 may omit any of the test circuits.

In operation, magnetic target 102 moves or rotates relative to magnetic sensor 104. The relative movement causes changes or perturbations to magnetic field 106, which are detected by magnetic field sensing elements 202, 204, and/or 206. When the magnetic field sensed by magnetic field sensing element 202 is relatively strong, the voltage (or current) level of signal 202a will be relatively high. Likewise, when the magnetic field sensed by magnetic field sensing elements 204 and 206 is relatively high, the voltage (or current) levels of signals 204a and 206a will be relatively high. Magnetic field sensing elements 202, 204, and 206 can also be configured so that the signals 202a, 204a, and 206a are relatively low when the magnetic field sensing elements detect a relatively strong magnetic field.

As teeth 110 move relative to the magnetic field sensing elements, the magnetic field sensing elements detect changes in magnetic field 106. As tooth 110a rotates first past magnetic field sensing element 202 in the direction of arrow 230, signal 202a will indicate that a tooth was detected. Subsequently, as tooth 110a moves past magnetic field sensing element 204, signal 204a will indicate that a tooth was detected. Likewise, as tooth 110a rotates past magnetic field sensing element 206, signal 206a will indicate that a tooth was detected.

Differential amplifier 208 receives signals 202a and 204a and generates signal 208a, which represents a voltage difference between signals 202a and 204a. Similarly, differential amplifier 210 provides signal 210a, which represents a voltage difference between signals 204a and 206a. ADC 212 then converts signal 208a to digital signal 212a, and ADC 214 converts signal 210a to digital signal 214a. Digital signals 212a and 214a are received by processor 218, which processes the signals to determine speed and direction of target 102. Processor 218 then produces output signals 218a and 218b which carry information about the speed and direction, and which can be received by an external circuit or processor for subsequent processing. In embodiments, processor 218 can indicate an error condition by altering the voltage level of signals 218a and 218b. For example, processor 218 may generate a DC offset on signals 218a and/or 218b, which can be received by external circuitry, to indicate an error condition.

Signals 218a and 218b may be digital or analog signals. In an embodiment, signals 218a and 218b may be an SMBus or I2C bus. In another embodiment, signals 218a and 218b comprise analog signals, such as ground, and a signal line that carries information about speed and direction of target 102.

One skilled in the art will note that, if sensor 104 includes only one magnetic field sensing element, such as magnetic field sensing element 202, and teeth 110 are regularly spaced and shaped, then sensor 104 may be able to detect only speed of target 102 by counting (for example) the times that teeth 110 and 110a are detected over a particular time period. However, if sensor 104 contains more than one magnetic field sensing element, sensor 104 can also detect direction by measuring the phase between the output signals of the magnetic field sensing elements. In the embodiment shown in FIG. 2, sensor 104 can detect speed by measuring the number of times signal 208a and/or 210a indicates that a tooth was detected. Additionally or alternatively, sensor 104 can detect the direction of target 102 by measuring the phase between signals 208a and 210a.

During operation, test circuit 224 may monitor signals 208a and 210a, and compare them to each other, to determine whether sensor 104 is detecting speed and/or direction accurately. In other embodiments, test circuit 224 will monitor digital signals derived from signals 208a and 210a, as will be described below. Test circuit 224 may also be configured to monitor digital signals 212a and 214a to determine if sensor 104 is detecting speed and/or direction accurately.

Test circuit 226 monitors ADC 212 to determine if ADC 212 is converting analog signal 208a to digital signal 212a accurately. For ease of illustration, test circuit 226 is shown coupled only to ADC 212 in FIG. 2. Test circuit 226 may also be coupled to ADC 214 to test the operation of ADC 214, or any other ADC in sensor 104.

Test circuit 228 monitors oscillating signal 216a to determine whether oscillator 216 is operating accurately.

Additionally, sensor 104 may include an IDDQ and/or BIST test circuit (not shown) that can be used to determine if there are any current leakage paths in sensor 104 during a start-up sequence or during operation of sensor 104. The IDDQ/BIST test may be performed while sensor 104 is installed in situ, e.g. mounted and operational within a vehicle. In an embodiment, the IDDQ/BIST test may be performed during a power on sequence. For example, if sensor 104 is installed in a motor vehicle, the IDDQ and/or BIST test may be performed prior to, during, or just after ignition when the sensor 104 comes online.

Figure 3:
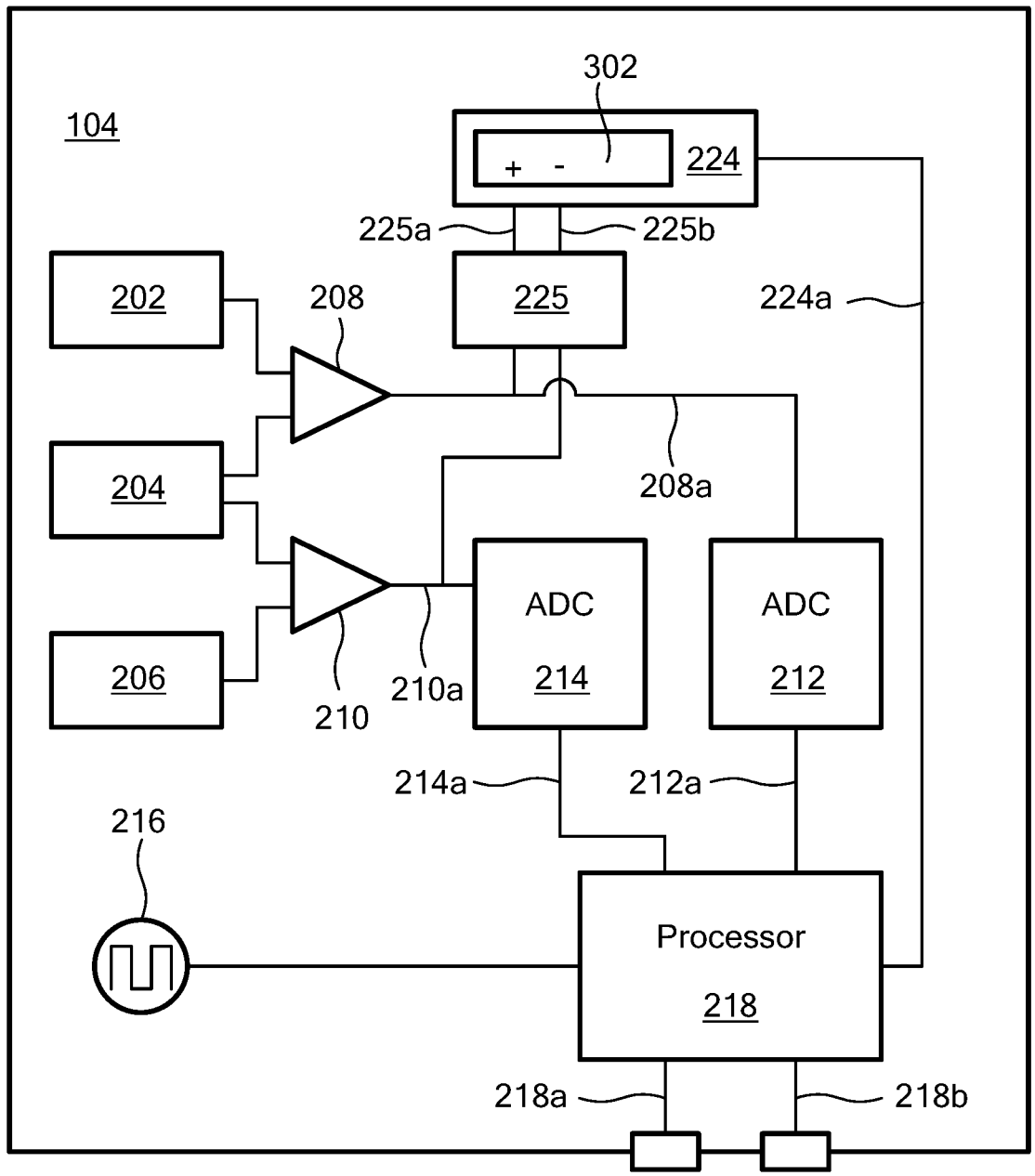
FIG. 3 is a block diagram of a magnetic field sensor including circuits to test accuracy of the sensor.

In FIG. 3, sensor 104 is shown having test circuit 224. Test circuits 226 and 228 are not shown for ease of illustration.

Test circuit 224 is configured to determine if the apparatus (i.e. sensor 104) is detecting speed and/or direction accurately. In an embodiment, a signal processing circuit 225 is coupled to receive signals 208a and 210a. Signal processing circuit 225 may shape signals 208a and 210a prior to the signals being received by test circuit 224 using filters and other signal processing circuits to shape the analog waveforms. In an embodiment, signal processing circuit 225 may also convert signals 208a and 210a into digital signals 225a and 225b. In embodiments, signal processing circuit 225 may use various techniques including peak detection, edge detection, etc. to convert signals 208a and 210a into digital signals. Examples of some such techniques are described in U.S. Pat. Nos. 6,091,239; 6,297,627; and 8,299,783; which are owned by the assignee of this application and are incorporated by reference here in their entirety.

Test circuit 224 includes a counter 302 coupled to signal 225a and 225b, such that signal 225a increments the counter and signal 225b decrements the counter. As shown, signal 225a is coupled to an incrementing input of counter 302 and signal 225b is coupled to a decrementing input of counter 302. Test circuit also includes circuitry to assert an error condition if a count of the counter exceeds a predetermined threshold. For example, if an error condition is detected, test circuit 224 may generate an error signal (e.g. signal 224a).

Figure 4A:
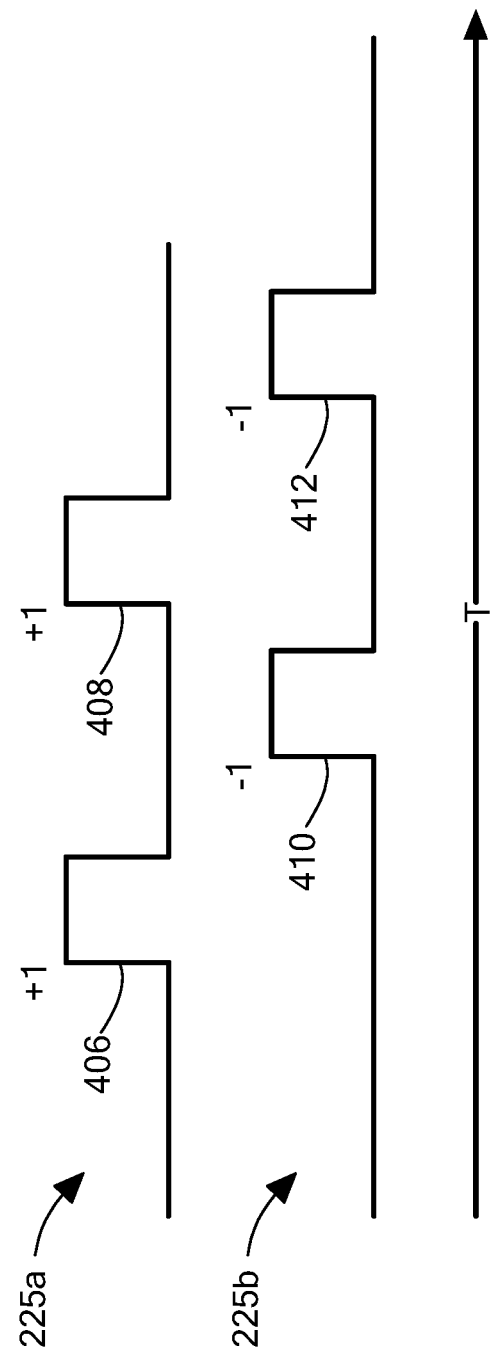
FIGS. 4A and 4B are graphs of signals that may be used in testing accuracy of the sensor of FIG. 3.

Referring to FIG. 4A, signals 225a and 255b are shown over time T. The vertical axis represents a voltage level of signals 225a and 255b and the horizontal axis represents time. As noted above, these signals correspond to detection of a tooth 110 of target 102. When a rising edge 406 or 408 appears on signal 225a, indicating that a tooth is detected, counter 302 increments its count (as indicated by "+1" at each rising edge in FIG. 4A). When a rising edge 410 or 412 appears on signal 255b, counter 302 decrements its count (as indicated by the "−1" at each rising edge).

As target 102 rotates, detection of tooth 110 will be indicated first by signal 225a then by signal 255b, or vice versa, depending upon the direction of rotation of target 102. Therefore, as target 102 rotates, the rising edges on signals 225a and 255b will alternate. Thus, counter 102 will be alternately incremented and decremented by the signals as long as magnetic field sensing elements 202, 204, and 206, and differential amplifiers 208 and 210 are operating normally. Assuming counter 302 starts counting at 0, the count should not go above 1 or below −1 under normal operating conditions. If the count becomes larger or smaller than a predetermined threshold, say larger than 1 or smaller than −1, it may indicate that one or more of the magnetic field sensing elements 202, 204, and 206, or differential amplifiers 208 and 210 are not functioning properly. If the count exceeds the predetermined threshold, it may indicate that the magnetic field sensing elements and differential amplifiers are not detecting the tooth properly or are reporting false positives.

Figure 4B:
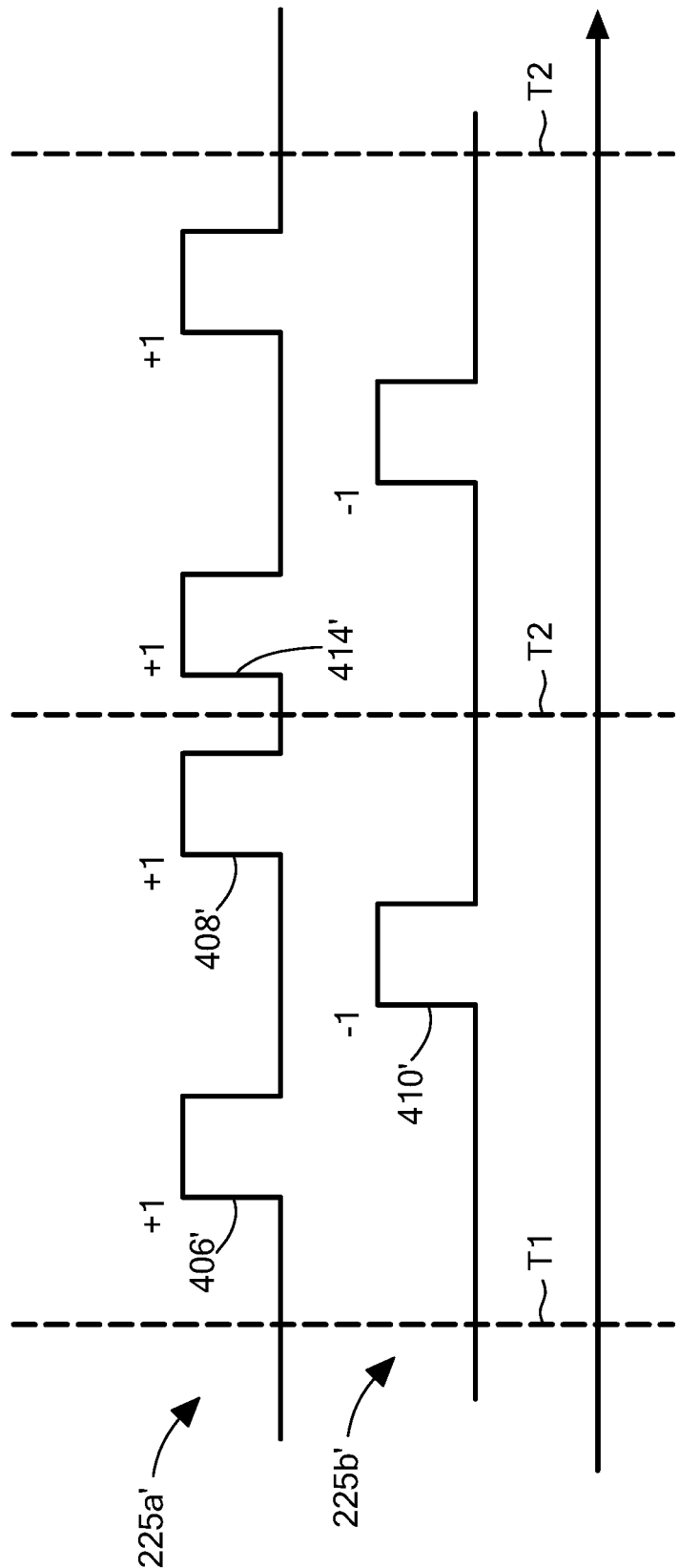

In some instances, if it is expected that target 102 will change directions during operation, the predetermined threshold can be set to a higher value, for example 2 or −2 instead of 1 or −1. FIG. 4B illustrates a scenario where target 102 changes direction. Between times T1 and T2, target 102 is rotating in one direction. Rising edges 406' and 408' cause the counter to increment and rising edge 410' causes the counter to decrement. However, at time T2, target 102 changes direction. The change in direction can cause two adjacent rising edges on signal 225a' (or on signal 255b'), as illustrated by adjacent rising edges 408' and 414', which can cause the count to increase to a value of 2. Thus, the predetermined threshold may be set to 2 (and/or −2) to compensate for changes in direction of target 102. In other embodiments, target 102 may have additional teeth or more closely-spaced teeth. Accordingly, the predetermined threshold may be set to any appropriate value to compensate for the spacing and number of teeth detected by sensor 104.

One skilled in the art will recognize that, although rising edges are used as an example to trigger the counter, other signal properties such as falling edges, voltage level, current level, etc., may be used to trigger the counter.

If the count exceeds the predetermined threshold, test circuit 224 may produce an error condition on signal 224a. Processor 218 may receive the error condition and subsequently produce an error condition on signal 218a and/or 218b, which can be received and processed by a circuit or processor external to sensor 104.

Figure 5:
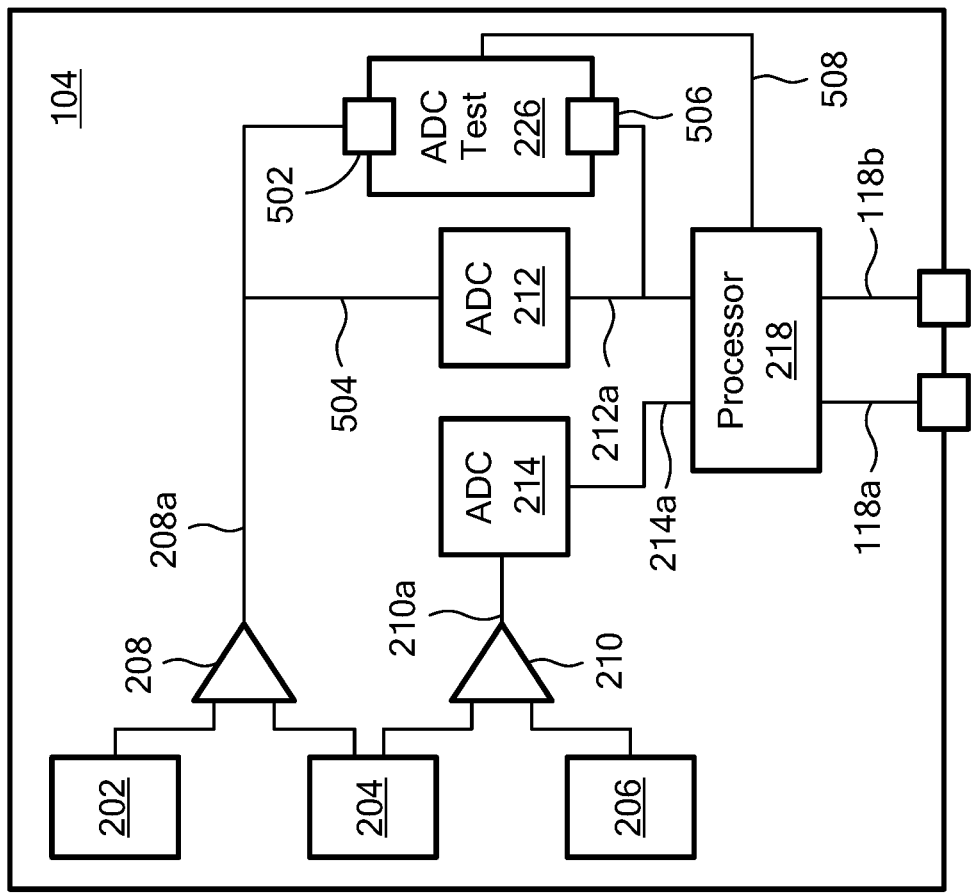
FIG. 5 is a block diagram of a magnetic field sensor including circuits to test an analog-to-digital converter.

Referring to FIG. 5, sensor 104 may include a test circuit 226 coupled to one or more analog-to-digital converters to determine whether the analog-to-digital converters are operating with an expected accuracy. In FIG. 5, test circuit 226 is shown coupled to ADC 212. Additionally or alternatively, test circuit 226 may be coupled to ADC 214 or any other analog-to-digital converter within sensor 104.

Test circuit 226 includes an output 502 to inject an analog test signal into an input 504 of the analog-to-digital converter 212. Test circuit 226 also includes an input 506 coupled to receive a digital signal from the analog-to-digital converter. The digital signal represents a conversion of the analog test signal. Test circuit 226 also includes a comparator circuit to compare the digital signal to an expected value. If the digital signal is not equal to or is not within an acceptable threshold of the expected value, test circuit 226 generates an error condition on signal 508, which is received by processor 118. Processor 118 can subsequently generate an error condition on signals 118a and/or 118b.

In operation, test circuit 226 may inject the analog test signal having a predetermined voltage value into ADC 212 at a predetermined time interval. Test circuit 226 then receives the output of ADC 212 and compares the output of ADC 212 to an expected value. Because the analog voltage level of the test signal is known, the output of ADC 212 can be compared to an expected digital value that corresponds to the analog voltage level to determine if ADC 212 is operating normally.

Test circuit 226 can also inject the analog test signal having a predetermined voltage value into ADC 212 in response to an expected event. For example, after the ADC output changes, there may be a period of time where the ADC output is not needed or used by other circuits. During this time, test circuit 226 can inject the analog test signal and measure the results of ADC 212's response to the test signal.

In an embodiment, test circuit 226 injects the analog test signal at a frequency that is sufficiently low so that the analog test signal will not significantly interfere with the normal operation of sensor 104. As an example, ADC 212 may convert signal 208a to digital data stream (i.e. signal 212a) having a frequency of F. Processor 118 receives the data stream and processes it to determine speed and direction of target 102. If test circuit 226 injects the test signal into ADC 212 at a frequency much lower than F, the test signal may not significantly interfere with the operations performed by processor 118. Additionally, processor 118 may include digital filters (such as a high pass or band pass IIR or FIR filter) that can remove the relatively low-frequency analog test signal from the data stream.

Additionally or alternatively, test circuit 226 injects the analog test signal into ADC 212 at a time when signal 208a is within a predetermined range. Test circuit 226 may, for example, inject the test signal during a time when a tooth of target 102 is not detected so that the analog test signal does not interfere with detection of target 102. Test circuit 226 may measure the voltage level of signal 208a to determine whether a tooth is currently detected.

To extract the results of the test signal, test circuit 226 may filter output of ADC 212. As mentioned above, the test signal may be injected into ADC 212 at a frequency that is sufficiently low or sufficiently high to allow test circuit 226 to use a low-pass or high-pass filter to extract the results. Additionally or alternatively, if the test signal is time interleaved with the normal ADC signal (i.e. if the test signal is injected at a time when ADC 212's output is not needed by other circuitry, then test circuit 226 may measure the output of ADC 212 contemporaneously with or after a small delay following injection of the test signal.

Test circuit 226 may also receive the digital output signal (i.e. signal 212a) from ADC 212, compute a rate of change of the output signal, and determine whether the rate of change is within a predetermined range defined by a mechanical system to which the target is attached. For example, assume target 102 is a ferromagnetic gear attached to an automotive cam shaft, which is coupled to a motor in an automobile. The motor has physical limitations, such as mass, power, etc., that define a maximum rate of acceleration/deceleration for the motor and the cam shaft. Thus, target 102 also has a maximum rate of acceleration.

Test circuit 226 can compute a rate of change of digital signal 212a by, for example, performing a time differential computation on digital signal 212a. In an embodiment, the time differential computation can be performed by subtracting a previous value of digital signal 212a from a current value of digital signal 212a. Other methods of performing a time differential computation can also be used.

The rate of change of digital signal 212a is representative of and proportional to the acceleration of the motor and cam shaft. If the computed rate of change is greater than a predetermined value representing a maximum possible acceleration of the motor and cam shaft, then it may indicate that ADC 212a is not operating properly and test circuit 226 may generate an error signal, as described above.

In an embodiment, test circuit 226 can determine whether the value of the output of ADC 212a is within a predetermined range defined by the mechanical system. For example, the mechanical system will have a maximum speed. Again considering the case where target 102 is a ferromagnetic target attached to an automotive cam shaft, target 102 will have a maximum expected angular velocity. If the output of ADC 212a indicates a velocity that is either too high or too low according to the mechanical system to which target 102 is attached, test circuit 226 may determine that ADC 212a is not operating correctly and may generate an error signal.

Figure 6:
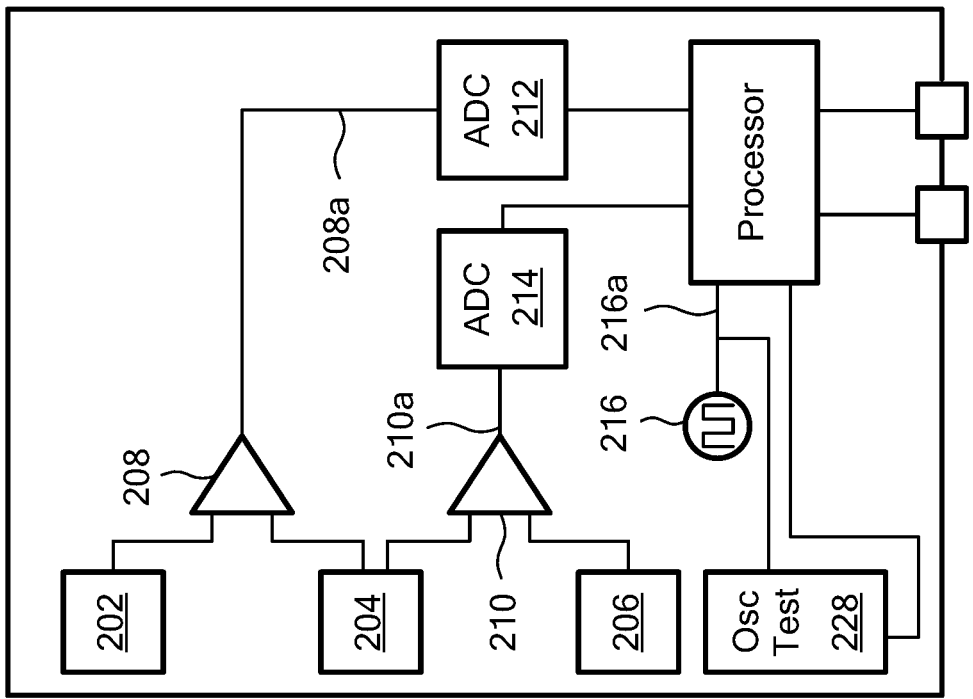
FIG. 6 is a block diagram of a magnetic field sensor including circuits to test an oscillator.
Figure 6A:
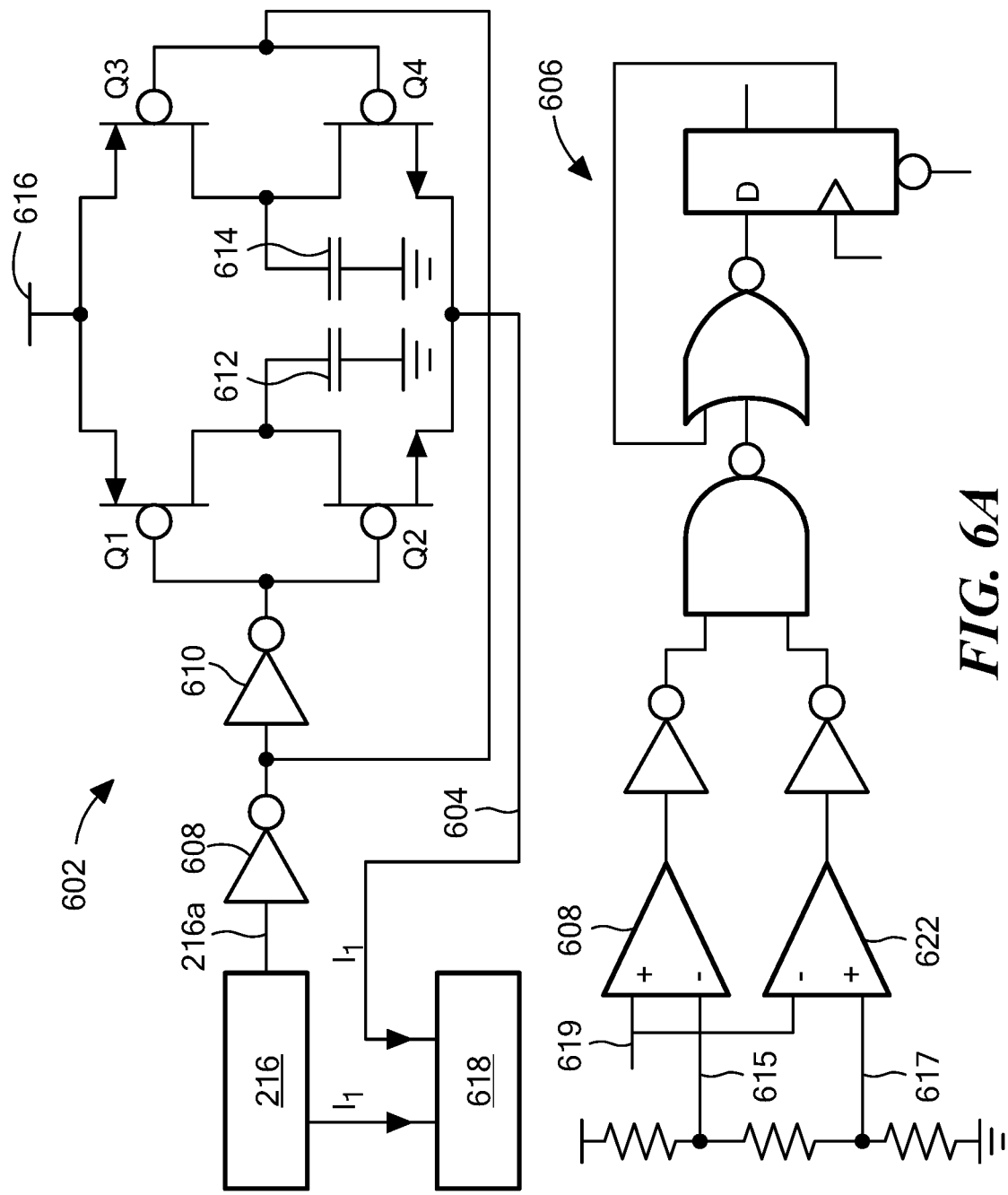
FIG. 6A is a circuit diagram of an oscillator test circuit.
Figure 6B:
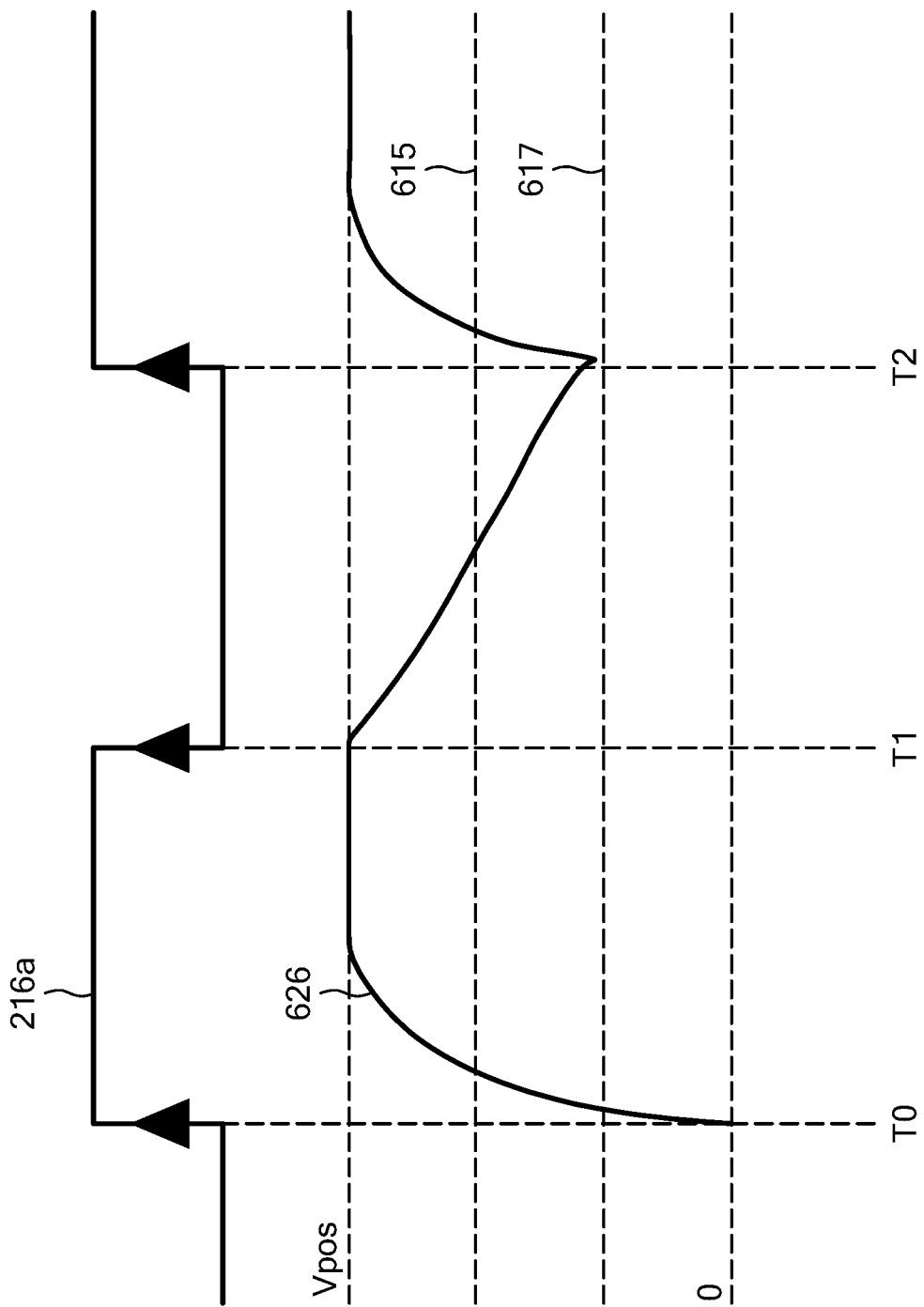
FIG. 6B is a graph of signals used and/or produced by the oscillator test circuit of FIG. 6A.

Referring to FIGS. 6, 6A, and 6B, sensor 104 may include a test circuit 228 coupled to the oscillator 216 to determine whether signal 216a is oscillating within a predetermined frequency range. Test circuit 228 may include a ramp generator circuit 602 that generates a voltage ramp signal (e.g. signal 604) that decays over time and resets upon detection of an edge of the oscillating output signal 216a. Test circuit 228 also includes a comparator circuit 606 to determine whether a voltage level of the voltage ramp signal is between a predetermined voltage range upon detection of an edge of the oscillating output.

Ramp generator circuit 602 includes transistors Q1, Q2, Q3, and Q4 which are coupled to act as switches to connect and disconnect capacitors 612 and 614 to voltage source 616 and current sink 618. Voltage source 616 supplies power to charge capacitors 612 and 614, and current sink 618 is coupled to discharge capacitors 612 and 614 at a predetermined rate.

Comparator circuit includes comparator 620 and comparator 622. Comparator 620 is coupled to receive a voltage reference signal 615 at its negative terminal and voltage signal 619. Voltage signal 619 may be the voltage across capacitor 612 or 614.

Comparator 622 is coupled to receive a voltage reference signal 617 at its positive terminal and the voltage signal 619 at its negative terminal. As will be discussed below, the difference between the voltage reference signals 615 and 617 may define a predetermined range used to determine whether oscillator 216 is oscillating within a predetermined frequency range.

In the embodiment shown in FIG. 6A, oscillating output signal 216a is received by the ramp generator circuit 602 to drive the gates of transistors Q1, Q2, Q3, and Q4. Inverters 608 and 610 are coupled to invert signal 216a so that, if the signal received at the gates of Q1 and Q2 is high, then the signal received at the gates of Q3 and Q4 is low, and vice versa. Therefore, when oscillating signal 216a is high (e.g. higher than the threshold switching voltage of inverter 608), Q2 and Q3 will be on (i.e. will conduct current) while Q1 and Q4 will be off (i.e. will act as an open circuit). With the transistors in these states, capacitor 614 will be charged by voltage source 616 while capacitor 612 will be discharged by current sink 618. When oscillating signal 216a is low (i.e. below the switching voltage of inverter 608), Q2 and Q3 will be off, while Q1 and Q4 will be on. Thus, capacitor 614 will be discharged by current sink 618 while capacitor 612 will be charged by voltage source 616. As signal 216a continues to oscillate between high and low, capacitors 612 and 614 will be alternately charged and discharged by voltage source 616 and current sink 618, respectively.

In FIG. 6B, signal 626, which represents the voltage across capacitor 614, and oscillating signal 216a are plotted versus time. For ease of illustration, the waveforms in FIG. 6B and the operation of the circuits in FIG. 6A will be described with respect to charging and discharging capacitor 614 to determine whether oscillator 216 is operating within a predetermined frequency range. However, one skilled in the art will recognize that the same or a similar analysis can apply to the charging and discharging of capacitor 612 to determine if oscillator 216 is operating within a predetermined frequency range. In embodiments, one capacitor can be used, or both capacitors 614 and 612 can be alternately or simultaneously used to determine if oscillator 216 is operating within a predetermined frequency range. Also for ease of illustration, signal 216a is shown as a square wave. One skilled in the art will recognize that signal 216a may be a regular or irregular oscillating waveform of any appropriate shape.

At time T0, signal 216a transitions to a high state. Therefore, Q3 is closed and Q4 is open, allowing capacitor 614 to be charged by voltage source 616. Thus, while signal 216a is high, between times T0 and T1, signal 626 rises and plateaus once capacitor 614 is charged. At time T1, signal 216a transitions to a low state. This opens Q3 and closes Q4, allowing capacitor 614 to be discharged by current sink 618. Current sink 618 provides a constant, predetermined current so that capacitor 614 discharges at a constant, predetermined rate.

At time T2, signal 216a transitions again to a high state. At this time, comparator circuit 606 measures the voltage level of signal 626 by, for example, comparing the voltage level of signal 626 to one or more reference voltages, to determine if the voltage level falls within a predetermined range.

As noted above, comparators 620 and 622 may be coupled to reference voltages. In an embodiment, the negative terminal of comparator 620 may be coupled to a reference voltage signal 615, and the positive terminal of comparator 622 may be coupled to reference voltage signal 617. Thus, at time T2, if signal 626 has a voltage greater than voltage reference signal 615, comparator 620 will indicate an out of range condition, and if signal 626 has a voltage lower than voltage reference signal 617, comparator 622 will indicate an out of range condition.

Because current sink 618 discharges capacitor 614 at a constant rate, it will take a predetermined amount of time for signal 626 to discharge to a level between voltage levels 628 and 630. One skilled in the art will recognize that current sink 618, capacitor 616, and reference voltage levels 628 and 630 may be adjusted or designed so the predetermined amount of time corresponds to a desired time period and/or frequency of oscillating signal 216a. Thus, if the period of oscillation of signal 216a is within the desired range, then the voltage level of signal 626 will be between the reference voltages 628 and 630 at time T2 when oscillating signal 216a changes state. If the period of oscillation is too short (i.e. the frequency of signal 216a is too high), then the voltage level of signal 626 will be greater than voltage level 628 and out of range at time T2. Similarly, if the period of oscillation is too long (i.e. the frequency of signal 216a is too low), then the voltage level of signal 626 will be less than voltage level 630 and out of range at time T2.

One skilled in the art will recognize that capacitor 614 and transistors Q3 and Q4 may be used to test the frequency of oscillating signal 216a between times T1 and T2, while capacitor 612 and transistors Q1 and Q2 may be used to test the frequency of oscillating signal 216a between times T0 and T1.

Figure 7:
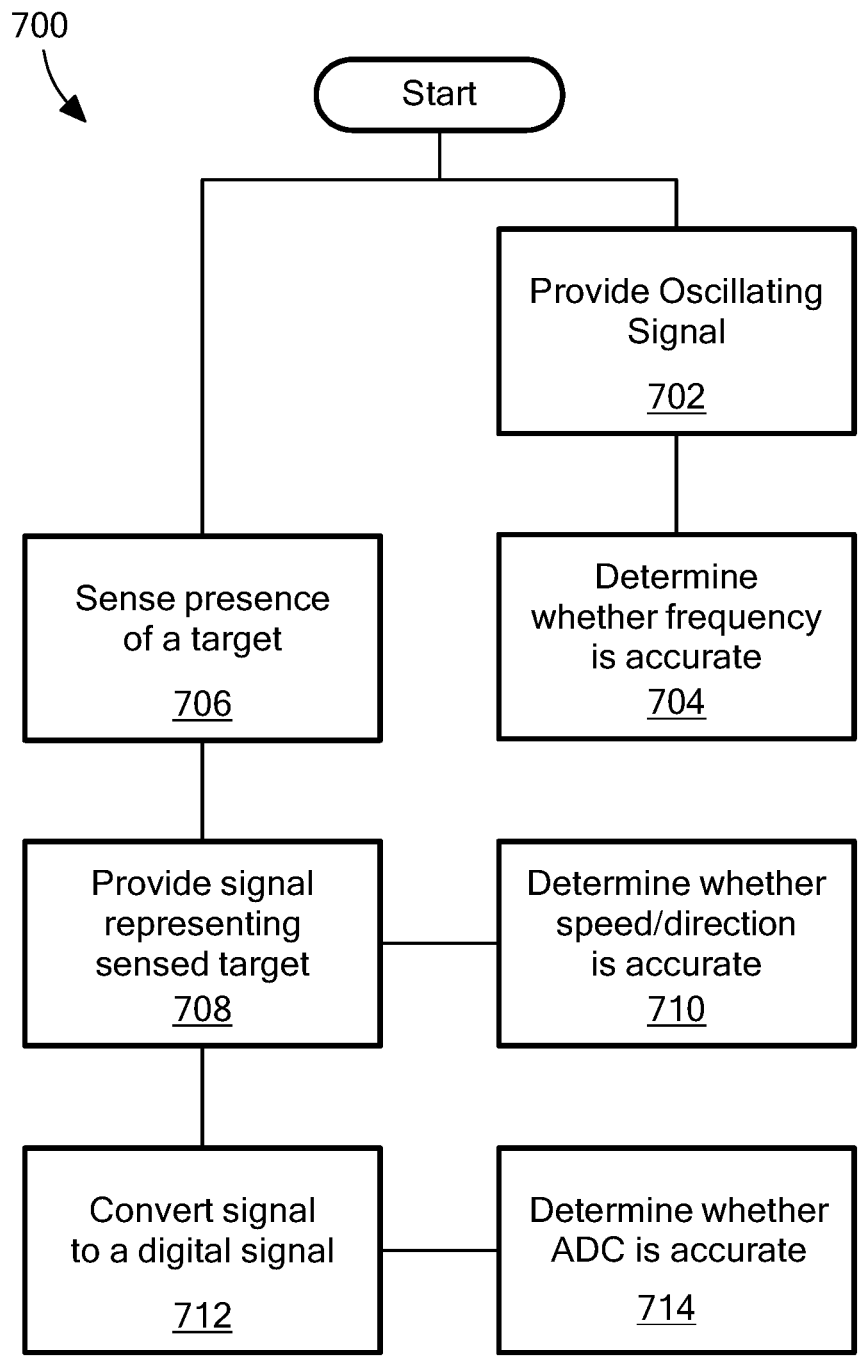
FIG. 7 is a flowchart of a method for testing a magnetic field sensor.

Referring now to FIG. 7, a flowchart illustrates a process 700 for sensing a magnetic target. When the magnetic sensor is turned on, an oscillating signal (e.g. signal 216a) is provided in box 702. The sensor determines whether the frequency of the oscillating signal is accurate in box 704, and may generate an error signal if it is not accurate.

While the oscillating signal is provided, the sensor may sense the presence (or absence) of a magnetic target in box 706, and may provide an output signal representing the sensed target in box 708. In box 710, the sensor may determine whether the speed and direction of the signal representing the sensed target are accurate, and may raise an error condition if one or both are not accurate.

The sensor also converts the sensed signal to a digital signal in box 712 via an analog to digital converter circuit such as ADCs 212 and 214. In box 714, the sensor determines whether an analog to digital converter circuit is operating accurately, and may raise an error if it is not operating accurately.

Figure 8:
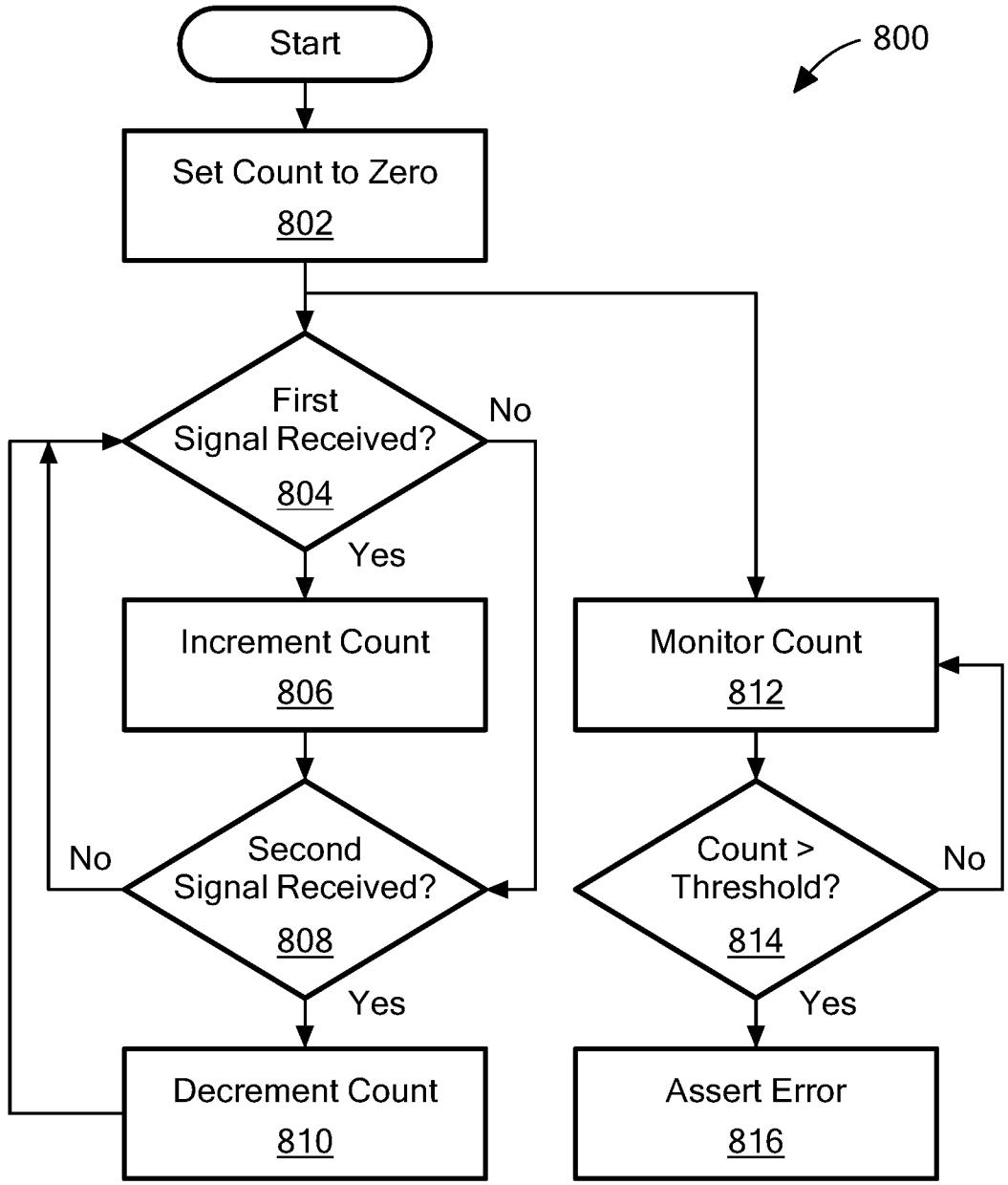
FIG. 8 is a flowchart of a method for testing accuracy of a magnetic field sensor.

FIG. 8 includes a flowchart depicting a process 800 to determine if speed and direction of a magnetic target are being sensed accurately. In box 802, a count (e.g. the count maintained by counter 302 in FIG. 3) is reset. If a first signal is received in box 804 (e.g. signal 225a), then the count is incremented in box 806. If a second signal is received in box 808, then the count is decremented in box 810. The process then advances to box 804 again and repeats.

While the count is incremented and decremented, the sensor may monitor the count in box 812. If the count exceeds a predetermined threshold in box 814, then an error condition may be asserted in box 816. The predetermined threshold may include high and low thresholds. If the count is greater than the high threshold, or less than the low threshold, the error condition may be asserted. In an embodiment, the high threshold has a positive value and the low threshold has a negative value.

Referring to FIG. 9, a flowchart shows a process 900 for determining the accuracy of an analog-to-digital converter circuit, such as ADC 212 or ADC 214 in FIG. 5. Referring also to FIG. 5, sensor 104 may inject a test signal into ADC 212 or ADC 214 as shown in box 902. In box 904 the output of the ADC is measured, and in box 906 it is compared with threshold limits to determine if the ADC output is within the threshold. If the ADC output is outside the threshold limits, an error may be asserted in box 908.

Referring to FIG. 10, a flowchart shows another process 1000 for determining the accuracy of an analog-to-digital converter circuit. In box 1002, a digital signal is received from the ADC. A rate of change (e.g. a slope or differential) with respect to time of the differential signal is computed in box 1004. In box 1006, process 1000 determines whether the rate of change is within a predetermined threshold or range. If not, an error condition is asserted in box 1008.

Figure 11:
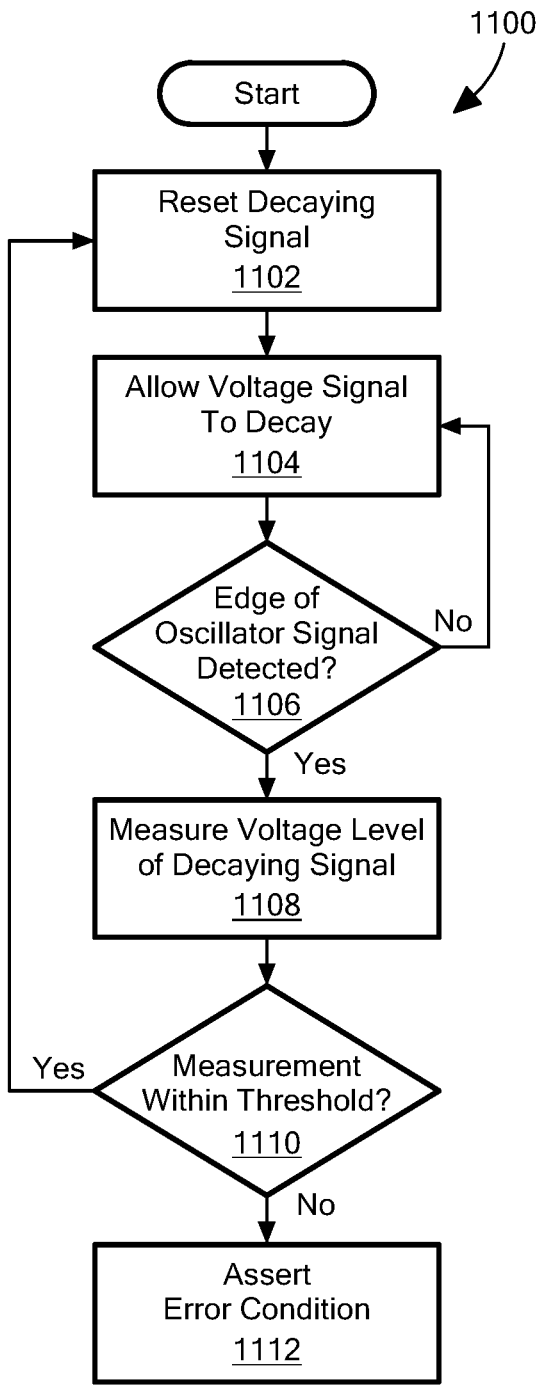
FIG. 11 is a flowchart of a method for testing an oscillator.

Referring to FIG. 11, a fluorescent shows a process 1100 for determining whether an oscillator is oscillating within a predetermined threshold. Referring also to FIGS. 6A and 6B, a decaying signal, e.g. signal 626 between times T1 and T2, is reset in box 1102. Resetting the signal may include placing transistor Q3 into a conducting state to charge capacitor 614, as described above.

In box 1104, the signal is allowed to decay as shown, for example, by signal 626 between times T1 and T2. If an edge is detected in box 1106 (e.g. the rising edge of signal 216a at time T2), then the voltage level of the decaying signal (e.g. signal 626) is measured in box 1108. The voltage level of the decaying signal may be measured, for example, by comparing the signal to one or more reference voltages, as described above.

If the voltage measurement is not within a predetermined range or threshold in box 1110, then an error condition may be asserted in box 1112.

Figure 12:
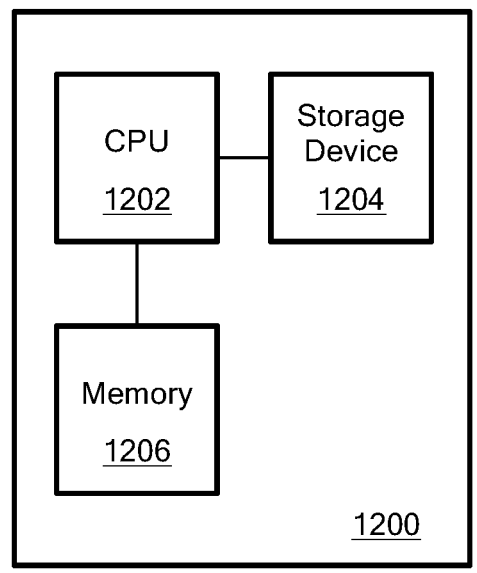
FIG. 12 is a block diagram of a computational circuit.

FIG. 12 is a block diagram of a computational circuit 1200, which can perform at least some of the processing described above. Computational circuit 1200 may be the same as or similar to circuit 218 in FIG. 2, for example.

Computational circuit 1200 may include a central processing unit (CPU) 1202 coupled to a storage device 1204 and a memory 1206. CPU 1202 can be a general purpose processor, a custom-designed processor, a microprocessor, or any other type of processor or circuit that can execute software instructions.

Storage device 1204 comprises a non-volatile memory such as a ROM, flash memory, F-RAM, solid-state drive, etc. Storage device 1204 may be either read-only or read/write. In other embodiments, storage device 1204 is a hard-drive, DVD, CD, or other type of disc device.

Memory 1206 comprises a volatile memory, such as a RAM. In certain embodiments, RAM 1206 may be omitted from computational circuit 1200.

In operation, CPU 1202 may read and execute software instructions from storage device 1204. When executed, the instructions may cause CPU 1202 to perform functions and operations as described above with respect to processor 218. In certain embodiments, CPU 1202 may copy the instructions from storage device 1204 to memory 1206 prior to executing the instructions. CPU 1202 may also read and write data to and from storage device 1204 and memory 1206. In other embodiments, computational circuit may comprise programmable hardware logic (e.g. a PLA), an FPGA, an ASIC, or any other type of hardware circuit or device capable of performing at least some of the functions described above and/or executing software instructions that cause the computational circuit to perform at least some of the functions described above.

What is claimed is:

1. An apparatus comprising:
   a detection circuit to detect speed and direction of a target, the detection circuit comprising:
   one or more output terminals to provide output signals representing the detected speed and/or the detected direction; and
   an oscillator; and
   a first test circuit configured to determine whether the oscillator is operating within a predetermined frequency range; and
   a second test circuit configured to measure a voltage level of a voltage ramp signal from the first test circuit after the voltage ramp signal has decayed for a period of time, wherein the second test circuit comprises:
   a first comparator to compare the voltage ramp signal to a predetermined upper voltage; and
   a second comparator to compare the voltage ramp signal to a predetermined lower voltage.

2. The apparatus of claim 1, wherein the a first test circuit is coupled to the oscillator to determine whether the oscillator is operating within a predetermined frequency range, and
   wherein the first test circuit is configured to assert an error condition on at least one of the output terminals if the oscillator is not operating within the predetermined frequency range.

3. The apparatus of claim 1, wherein the first test circuit comprises a ramp generator that generates the voltage ramp signal that decays over time and resets upon detection of an edge of an output signal of the oscillator.

4. The apparatus of claim 3, further comprising a voltage level test circuit to measure a voltage level of the voltage ramp signal after the voltage ramp signal has decayed for a period of time.

5. The apparatus of claim 4, wherein the period of time comprises a period of the oscillator.

6. The apparatus of claim 1, wherein the first test circuit comprises a switched capacitor resistor having at least one switch controlled by an output of the oscillator.

7. The apparatus of claim 1, further comprising at least one magnetoresistance element configured to provide a signal indicative of changes in a magnetic field resulting from movement of the target.

8. The apparatus of claim 1, further comprising an analog-to-digital converter (ADC) comprising an input port and an output port, wherein the input port is configured to receive a signal from at least one magnetoresistance element.

9. The apparatus of claim 8, further comprising an ADC test circuit connected to the input port and the output port of the ADC, wherein the ADC test circuit is configured to:
   inject a test signal into the input port of the ADC;
   measure, at the output port of the ADC, an ADC output signal; and
   determine whether the ADC output signal is an expected value; and
   generate an error signal in response to the ADC output signal not being the expected value.

10. The apparatus of claim 9, further comprising a processor configured to:
    receive the ADC output signal;
    receive the error signal; and
    send an error condition to the one or more output terminals by altering voltages on the output signals in response to receiving the error signal, wherein the processor is connected to the output port of the ADC and the ADC test circuit.

11. The apparatus of claim 10, wherein the first test circuit is further configured to calculate an average value of an output of the ADC circuit and compare the calculated average value to a predetermined value.

12. An apparatus comprising:
    a detection circuit to detect speed and direction of a target, the detection circuit comprising:
    one or more output terminals to provide output signals representing the detected speed and/or the detected direction; and
    an oscillator;
    a first test circuit, coupled to the oscillator, configured to determine whether the oscillator is operating within a predetermined frequency range and configured to assert an error condition on at least one of the output terminals if the oscillator is not operating within the predetermined frequency range, wherein the first test circuit comprises a ramp generator that generates a voltage ramp signal that decays over time and resets upon detection of an edge of an output signal of the oscillator; and
    a second test circuit configured to measure a voltage level of the voltage ramp signal after the voltage ramp signal has decayed for a period of time, wherein the second test circuit comprises:
    a first comparator to compare the voltage ramp signal to a predetermined upper voltage; and a second comparator to compare the voltage ramp signal to a predetermined lower voltage.

13. The apparatus of claim 12, wherein the first test circuit comprises a switched capacitor resistor having at least one switch controlled by an output of the oscillator output.

14. The apparatus of claim 12, wherein the period of time comprises a period of the oscillator.

15. The apparatus of claim 12, further comprising at least one magnetoresistance element configured to provide a signal indicative of changes in a magnetic field resulting from movement of the target.

16. The apparatus of claim 12, further comprising an analog-to-digital converter (ADC) comprising an input port and an output port, wherein the input port is configured to receive a signal from at least one magnetoresistance element.

17. The apparatus of claim 16, further comprising an ADC test circuit connected to the input port and the output port of the ADC, wherein the ADC test circuit is configured to:
inject a test signal into the input port of the ADC;
measure, at the output port of the ADC, an ADC output signal; and
determine whether the ADC output signal is an expected value; and
generate an error signal in response to the ADC output signal not being the expected value.

18. The apparatus of claim 17, further comprising a processor configured to:
receive the ADC output signal;
receive the error signal; and
send an error condition to the one or more output terminals by altering voltages on the output signals in response to receiving the error signal, wherein the processor is connected to the output port of the ADC and the ADC test circuit.

19. The apparatus of claim 18, wherein the first test circuit is further configured to calculate an average value of an output of the ADC circuit and compare the calculated average value to a predetermined value.

* * * * *

UNITED STATES PATENT AND TRADEMARK OFFICE
CERTIFICATE OF CORRECTION

| | |
|---|---|
| PATENT NO. | : 11,585,868 B2 |
| APPLICATION NO. | : 16/994864 |
| DATED | : February 21, 2023 |
| INVENTOR(S) | : P. Karl Scheller et al. |

It is certified that error appears in the above-identified patent and that said Letters Patent is hereby corrected as shown below:

In the Specification

Column 2, Line 26 delete "signal channels" and replace with --signal channel--.

Column 2, Line 47 delete "value; and" and replace with --value.--.

Column 5, Line 1 delete "sensor." and replace with --sensor 104.--.

Column 5, Line 13 delete "element 202, 204," and replace with --elements 202, 204,--.

Column 5, Line 17 delete "signal 202a and 204a," and replace with --signals 202a and 204a,--.

Column 5, Lines 43-44 delete "be non-crystal" and replace with --be a non-crystal--.

Column 7, Line 49 delete "signal" and replace with --signals--.

Column 7, Line 58 delete "255b" and replace with --225b--.

Column 7, Line 60 delete "255b" and replace with --225b--.

Column 7, Line 66 delete "255b," and replace with --225b,--.

Column 8, Line 2 delete "255b," and replace with --225b,--.

Column 8, Line 5 delete "255b" and replace with --225b--.

Column 8, Line 5 delete "102" and replace with --302--.

Column 8, Line 30 delete "255b')," and replace with --225'),--.

Signed and Sealed this
Twenty-eighth Day of May, 2024

Katherine Kelly Vidal
*Director of the United States Patent and Trademark Office*

CERTIFICATE OF CORRECTION (continued)
U.S. Pat. No. 11,585,868 B2

Column 8, Line 66 delete "processor 118. Processor 118" and replace with --processor 218. Processor 218--.

Column 9, Line 22 delete ". Processor 118" and replace with --. Processor 218--.

Column 9, Line 27 delete "processor 118." and replace with --processor 218.--.

Column 9, Line 27 delete ", processor 118" and replace with --, processor 218--.

Column 9, Line 47 delete "circuitry," and replace with --circuitry)--.

Column 10, Line 6 delete "ADC 212a" and replace with --ADC 212--.

Column 10, Line 9 delete "ADC 212a" and replace with --ADC 212--.

Column 10, Line 15 delete "ADC 212a" and replace with --ADC 212--.

Column 10, Line 18 delete "ADC 212a" and replace with --ADC 212--.

Column 11, Line 51 delete ", capacitor 616," and replace with --, capacitor 614,--.

In the Claims

Column 13, Line 60 Claim 2, delete "the a first" and replace with --the first--.